United States Patent
Panther

(10) Patent No.: US 6,218,904 B1
(45) Date of Patent: Apr. 17, 2001

(54) BIASING SCHEME FOR GAASFET AMPLIFIER

(75) Inventor: Gyles Panther, Stittsville (CA)

(73) Assignee: Sigem Inc., Kanata (CA)

( * ) Notice: Subject to any disclaimer, the term of this patent is extended or adjusted under 35 U.S.C. 154(b) by 0 days.

(21) Appl. No.: 09/317,119

(22) Filed: May 24, 1999

(30) Foreign Application Priority Data

May 26, 1998 (CA) ................................................ 2238955

(51) Int. Cl.[7] ........................................................ H03F 3/04
(52) U.S. Cl. ........................... 330/296; 330/300; 330/302
(58) Field of Search .................................... 330/296, 300, 330/302, 305, 310; 323/313, 314

(56) References Cited

U.S. PATENT DOCUMENTS

| | | | |
|---|---|---|---|
| 5,532,650 | * 7/1996 | Igarashi | 330/300 |
| 5,548,248 | * 8/1996 | Wang | 330/302 |
| 5,705,953 | * 1/1998 | Jesser | 330/300 |
| 5,726,606 | * 3/1998 | Marland | 330/302 |
| 6,020,848 | * 2/2000 | Wallace et al. | 330/296 |

* cited by examiner

Primary Examiner—Robert Pascal
Assistant Examiner—Khanh Van Nguyen
(74) Attorney, Agent, or Firm—Pascal & Associates

(57) ABSTRACT

A bias circuit for a pair of field effect transistor (FET) stages comprising a circuit for AC coupling a signal amplified by a first stage to the input of a second stage, a power source for supplying DC operating current to both of the stages in series, a circuit for sensing current drawn by the second stage and in response thereto for controlling bias of the first stage, and a circuit for blocking AC signals amplified by the first stage from being passed via a DC operating current path to the second stage, whereby the same DC operating current is passed through both first and second stages and is blocked from passing through the AC coupling circuit.

21 Claims, 8 Drawing Sheets

BIASING SCHEME FOR GAASFET AMPLIFIER

FIELD OF THE INVENTION

This invention relates to the field of amplifiers using field effect transistor (FET) stages, and in particular to a biasing circuit that is usefully employed in low noise amplifiers operating at microwave frequencies, e.g. at least as high as 1 GHz.

BACKGROUND TO THE INVENTION

A low noise amplifier is typically used to amplify the received signal from an antenna at microwave frequencies. A block diagram of a system which uses a single stage low noise amplifier (LNA) as a first receiver block in such a system is shown in FIG. 1(a). An antenna sub-assembly 1 is comprised of an antenna 3 which feeds a low noise amplifier 5. A coaxial cable carries an amplified signal from the LNA to a receiver unit 9, and in particular typically to an anti-aliasing RF filter 11, which feeds its output to an RF amplifier 13 of the receiver unit.

FIG. 1(b) is a block schematic of a system which uses a two stage LNA in the antenna sub-assembly. An antenna 3 feeds a first stage LNA 5, which feeds an anti-aliasing filter 11, which feeds an RF amplifier 15. The output of amplifier 15 is carried by a coaxial cable 7 to a receiver unit 17, which applies its input signal to an amplifier mixer, etc.

GAAS and PHEMPT GAAS FET transistors are currently widely used in LNAs at frequencies of 1 GHz and higher. Such devices are of relatively low cost and offer very low noise and high gain at moderate currents and voltages.

The LNA is generally wideband relative to the signal bandwidth and usually does not impose limitation on signal modulation or architecture on the balance of the receiver system. For example, the LNA could be used for a narrow band quadrature phase-shift key (QPSK) system, or for a wideband direct sequence spread spectrum system, provided only that any in-line filters have sufficient bandwidth to pass the entire signal spectrum (as is the usual case).

Power consumption of the individual stages of such amplifiers is typically 10 mA from a 5V power supply; multiple stages increase the current draw proportionally. While this current draw is considered to be moderate as compared with earlier technology, it represents a substantial drain for battery powered equipment such as hand held global positioning system (GPS) receivers. It would therefore be desirable to reduce the current consumption.

A PHEMPT FET, when operated at a drain current of about 10 mA, has a negative gate to source voltage typically between 0.1V and 0.4V. If the source is grounded, it becomes necessary to bias the gate negatively with respect to ground to achieve the desired bias current. This is commonly achieved by the used of capacitive pump circuits which generate negative bias voltages. The PHEMPT gate input impedance (at DC) is very high and thus the input bias current is very low and the bias circuit current consumption can be made relatively low.

Variation in the source to gate threshold for GAAS FET transistors is not well controlled and consequently, additional control circuitry is required to regulate the bias current which flows in the circuit. Commonly, the negative bias voltage provided by the capacitive pump circuit simply provides the necessary biasing voltages and additional circuitry is required to implement the bias current control.

FIG. 2(a) is a schematic diagram which shows a means of biasing a PHEMPT FET without a negative bias pump. An FET receives an RF input signal at its gate. A high value resistor 23 is connected between the gate and ground, and another resistor 25, bypassed by a capacitor 27, is connected between its source and ground. A power source is connected to ground and is coupled to the drain of the FET.

This circuit relies on a degeneration resistor 25 connected to the source to control the bias current. A major disadvantage of this simple circuit is that the variation in gate threshold for PHEMPT FET devices is very poor, leading to wide tolerance of current draw.

FIG. 2(b) illustrates a biasing circuit which makes use of a negative bias device. An FET 21 has its input AC coupled (e.g. via capacitor 29) to the RF input. Its source is grounded. A capacitive pump 31 generates a DC voltage negative with respect to ground and provides it from its output to the gate of the FET via resistor 33. Capacitor 35 AC bypasses the output of pump 31 to ground.

However, in this case where a two stage LNA is to be employed, at least double the single stage typically 10 mA current is drawn.

While GAAS FETs and PHEMPT GAAS FETs are capable of operation at extremely high frequencies, it is important to provide well controlled AC source impedances at all ports up to the maximum frequency of operation to prevent spurious oscillations. For that reason, to achieve such control it is common practice to connect the GAAS FET source directly to the ground plane.

SUMMARY OF THE INVENTION

I have invented a way of approximately halving the current used in a two stage LNA. The invention involves using the same DC current in both stages of the amplifier. While the design superficially may resemble a cascode amplifier, the present invention is significantly different therefrom by the AC signal and DC current feed conduction paths being separate from each other. In a cascode circuit, while two transistors are stacked so that DC current flows through both transistors wherein the drain of one transistor feeds the source of the other, the current of one transistor modulates the source-drain current of the other. Thus the AC signal and DC conduction paths are not decoupled. In the present invention, the AC signal and DC conduction paths are decoupled, which provides significant advantages, as will be described later.

Further, the source of the first LNA FET can be biased to an arbitrary DC potential. This allows the DC path to be separated from the AC path, and in the present invention, the bias current in the second stage also flows in the first stage, thereby halving the current requirements.

An advantage of an embodiment of the present invention is that only one negative feedback stage is necessary to establish the bias current in both first and second stages of the LNA.

Another advantage is that the available supply voltage is "shared" between the FETs in the two stages, resulting in a very low drop-out voltage.

Another advantage is that the bias current is "used" twice, resulting in current consumption only half of that which would be required by a conventional circuit.

Another advantage is that the negative gate threshold of the first LNA FET allows its gate to be biased at ground, but which still provides sufficient "voltage headroom" for another transistor in series to act as a constant current sink.

Another advantage is that a single control node can be used to power down both stages of the LNA for power saving applications.

Another advantage is that the bias control is extremely precise because it is solely determined by resistor values and is independent of PHEMPT FET parameter variation.

In accordance with an embodiment of the present invention, a bias circuit for a pair of field effect transistor (FET) stages comprises a circuit for AC coupling a signal amplified by a first stage to the input of a second stage, a power source for supplying DC operating current to both of the stages in series, a circuit for sensing current drawn by the second stage and in response thereto for controlling bias of the first stage, and a circuit for blocking AC signals amplified by the first stage from being passed via DC operating current path to the second stage, whereby the same DC operating current is passed through both first and second stages and is blocked from passing through the AC coupling circuit.

In accordance with another embodiment, the bias circuit includes a circuit for comparing a voltage derived from the sensed current with a bandgap voltage and for raising or reducing bias as a result of any difference therebetween.

In accordance with another embodiment, the bias circuit includes a circuit for controlling a charge pump from said sensed current, and for controlling the bias by the charge pump.

In accordance with another embodiment the bias circuit includes a circuit for comparing a voltage derived from the sensed current with a bandgap voltage, a circuit for controlling a charge pump as a result of any difference therebetween, and for controlling the bias by the charge pump.

In accordance with another embodiment, the bias circuit has the first and second stages comprised of respective first and second FETs, the power source having one polarity node coupled to the drain of the second FET and having an opposite polarity node coupled to the source of the first FET, the circuit for sensing being comprised of a resistor which is DC coupled between the source-drain circuit of the second FET and the drain-source circuit of the first FET and a circuit for detecting a voltage drop across the resistor and for controlling bias of the first FET, and further including a circuit for blocking AC signals amplified by either of the FET stages from passing into DC current supply lines between the FETs and between the power source and one of the FETs.

In accordance with another embodiment, a bias circuit for a pair of field effect transistor (FET) stages comprises a circuit for AC coupling a signal amplified by a first stage to the input of a second stage, a power source for supplying DC operating current to both of the stages in series, a current source or sink for fixing the DC current passing through the stages in series, and a circuit for blocking AC signals amplified by the first stage from being passed via a DC operating current path to the second stage, whereby the same DC operating current is passed through both first and second stages and is blocked from passing through the AC coupling circuit.

In accordance with another embodiment, a bias circuit comprises a first n-channel FET and a second n-channel FET, an NPN bipolar transistor, the emitter of the bipolar transistor being connected to ground, the collector of the bipolar transistor being connected to the source of the first FET, a bypass capacitor connected between the collector and ground, a first resistor having a node connected to the drain of the first FET, a first coupling capacitor coupled between another node of the first resistor and the gate of the second FET, a circuit for applying a bias voltage to the gate of the second FET, a pair of chokes connected in series having one end node connected to the junction of the first coupling capacitor and the first resistor, a second bypass capacitor connected between the junction of the chokes and ground, a sensing resistor connected between another end node of the chokes and the source of the second FET, a third bypass capacitor connected between the source of the second FET and ground, a second resistor connected between the drain of the second FET and a terminal of a further choke, another terminal of the further choke being connected to a positive node of a power supply, a pair of resistors connected in series between the source of the second FET and ground, an input of an operational amplifier connected to a junction of the pair of resistors, another input of the operational amplifier connected to a junction of the sensing resistor and the pair of chokes, the output of the operational amplifier being connected to the base of the bipolar transistor, an input circuit for applying an input signal to the gate of the first FET, and an output circuit AC coupling an output signal connected to the junction of the second load resistor and the further choke.

BRIEF INTRODUCTION TO THE DRAWINGS

A better understanding of the invention may be obtained by reading the detailed description of the invention below, in conjunction with the following drawings, in which.

Figure 1A:
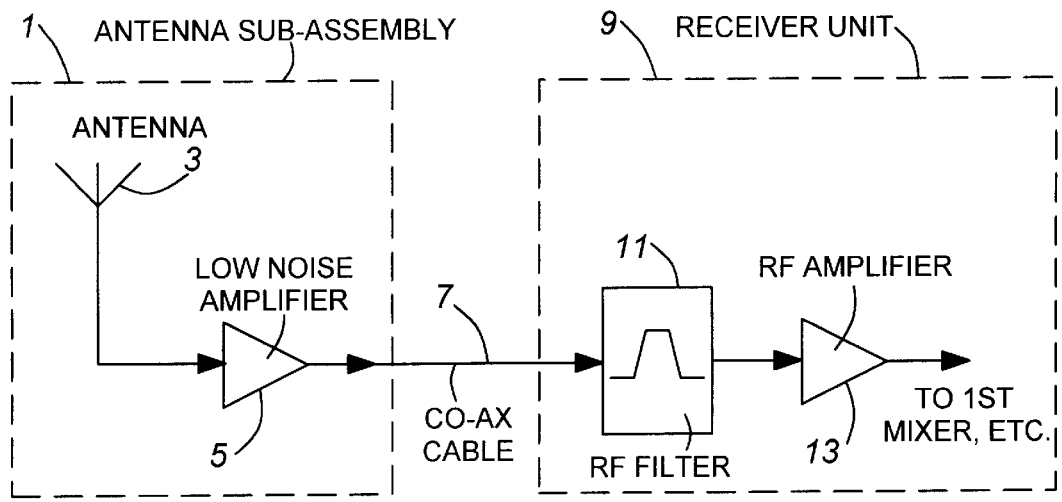
FIG. 1(a) is a block diagram of an amplifier which uses a single stage LNA.
Figure 1B:
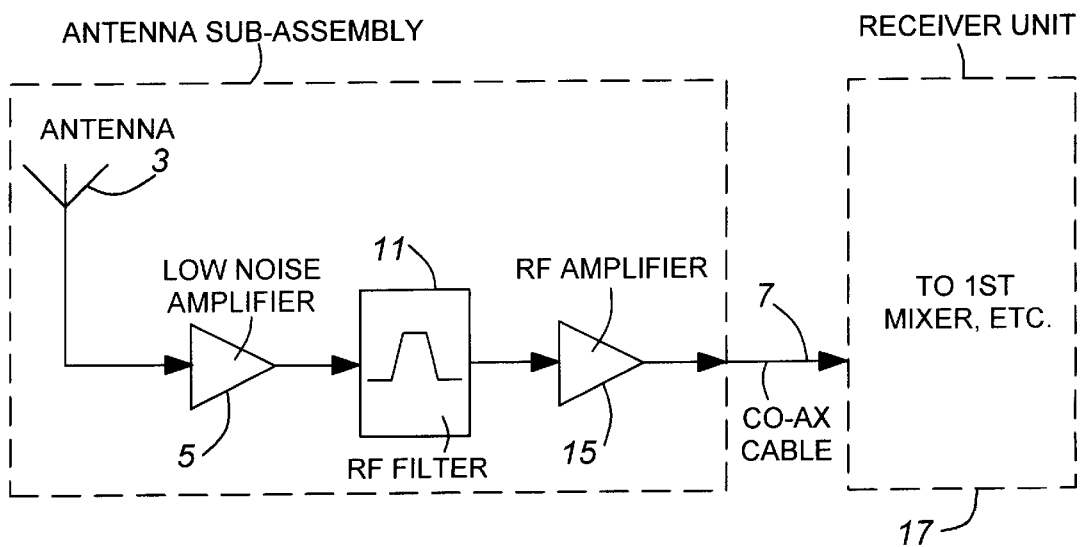
FIG. 1(b) is a block diagram of an amplifier which uses a two stage LNA.
Figure 2A:
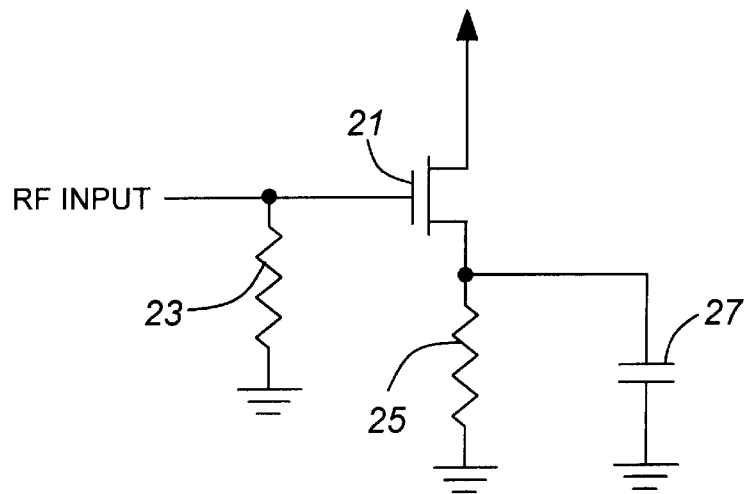
Figure 2B:
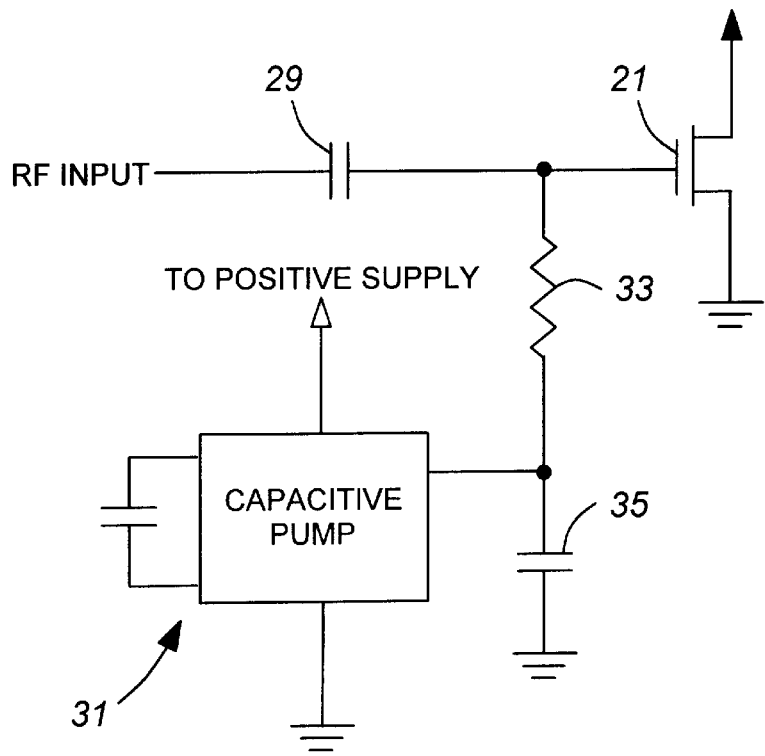
Figure 3:
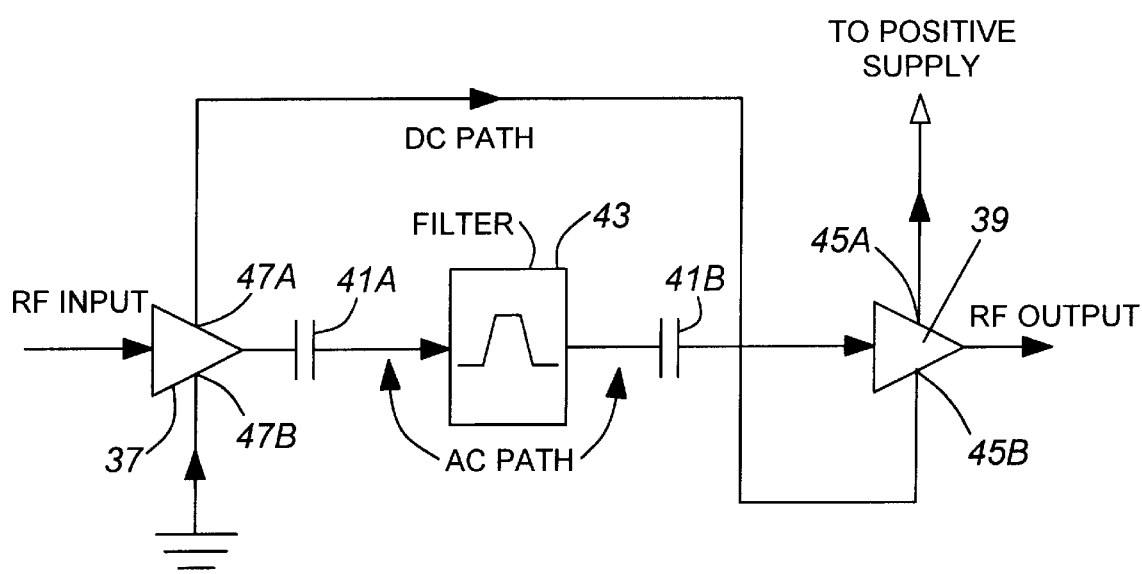
Figure 4:
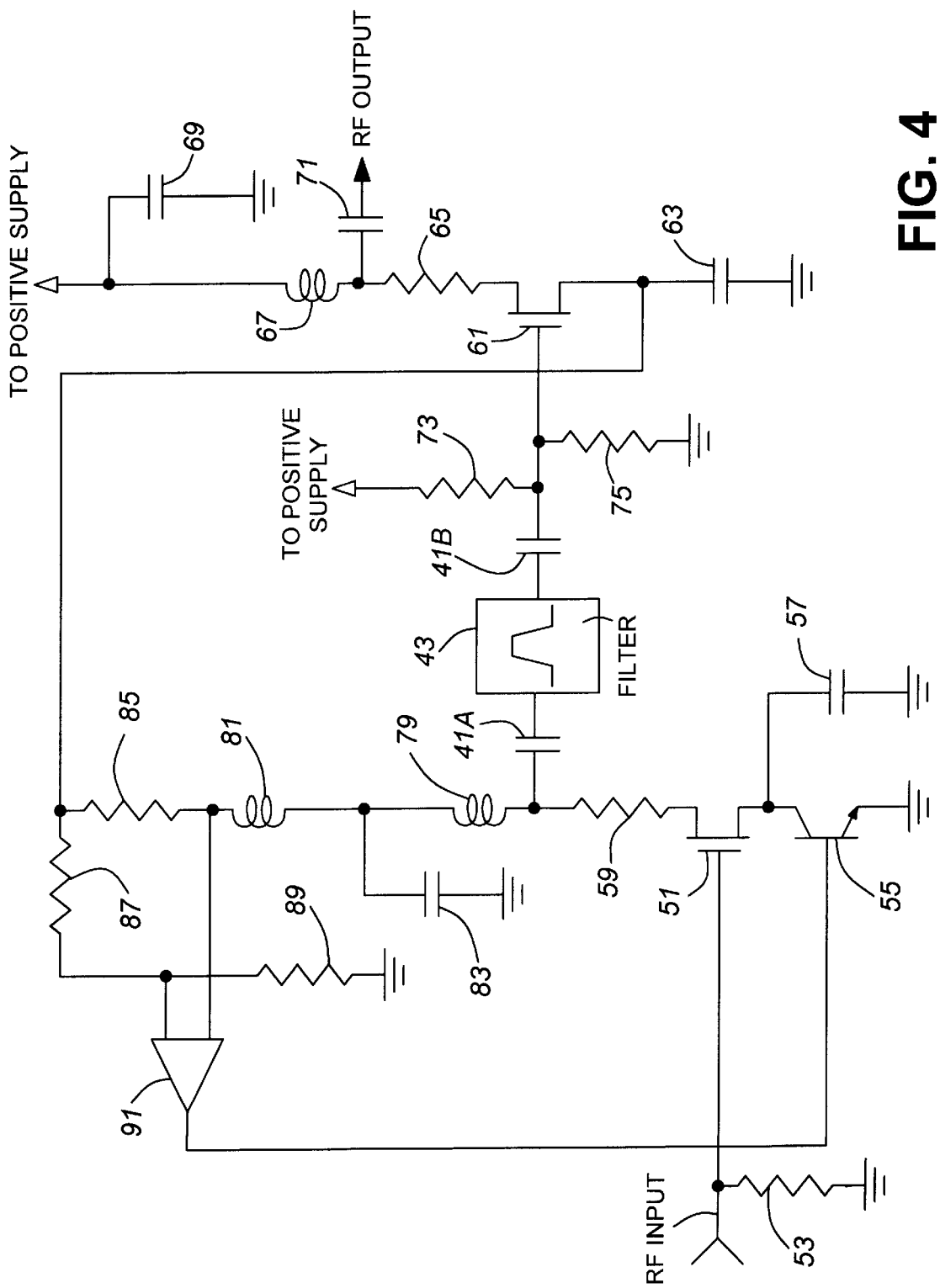
Figure 5:
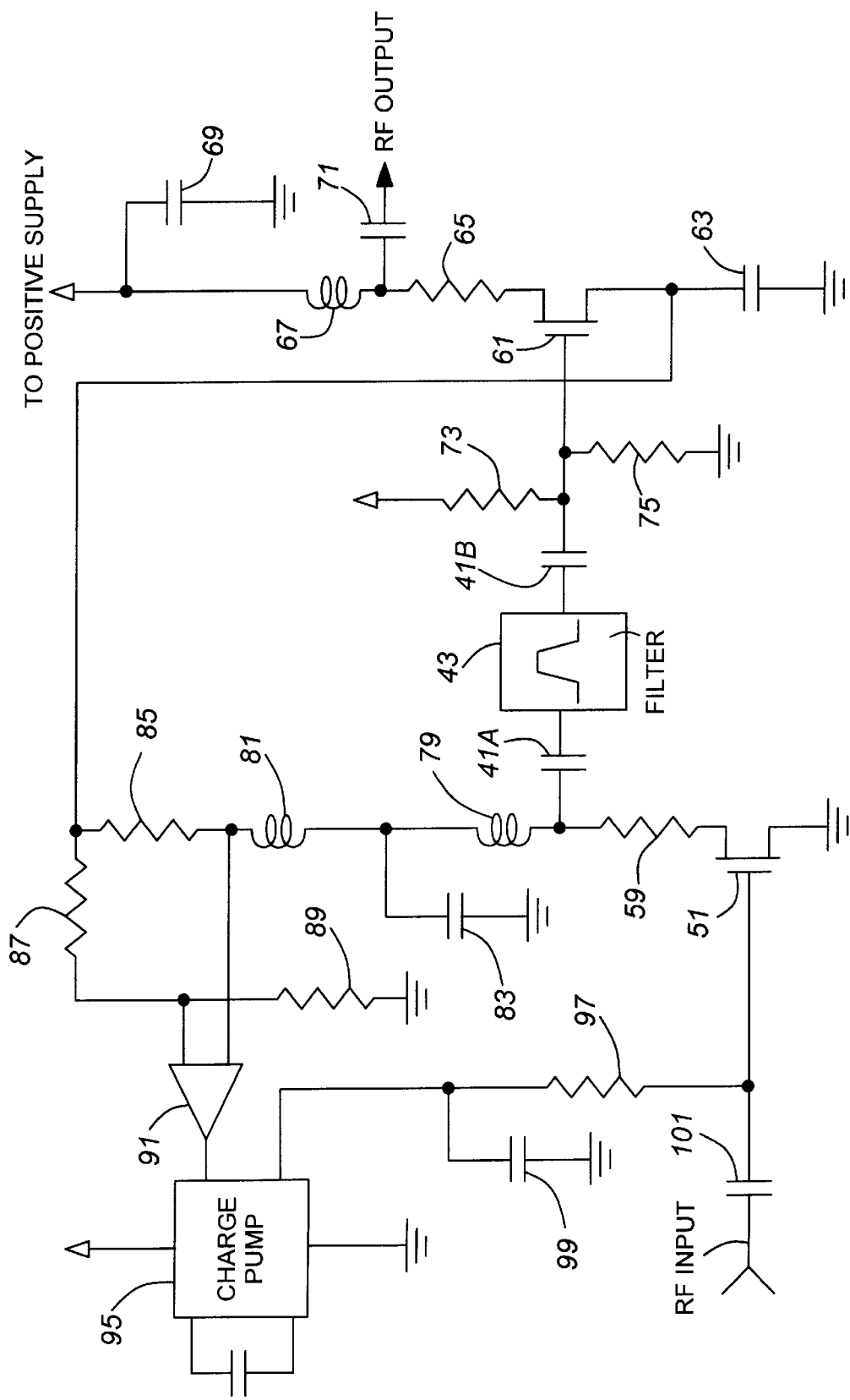
Figure 6:
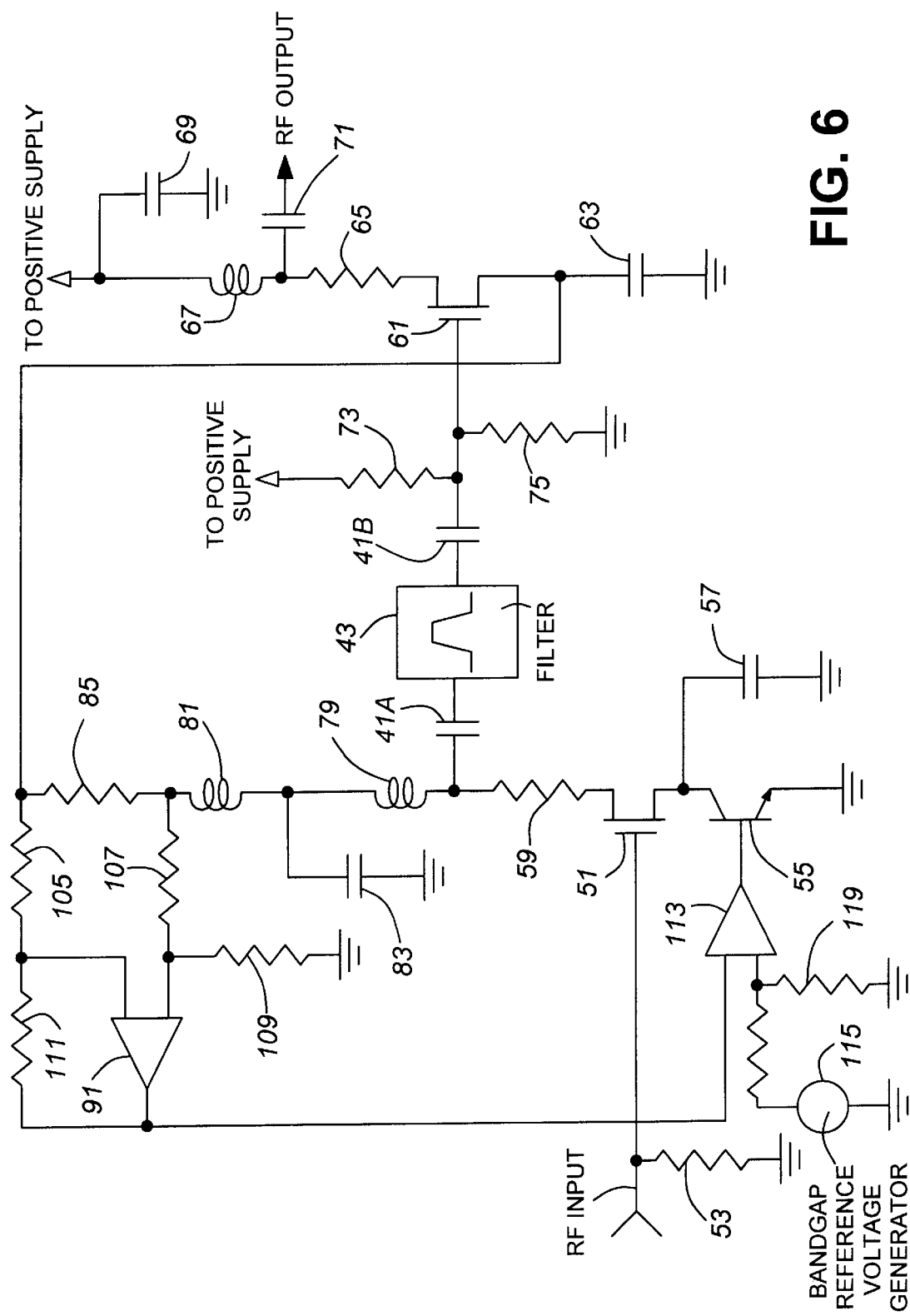
Figure 7:
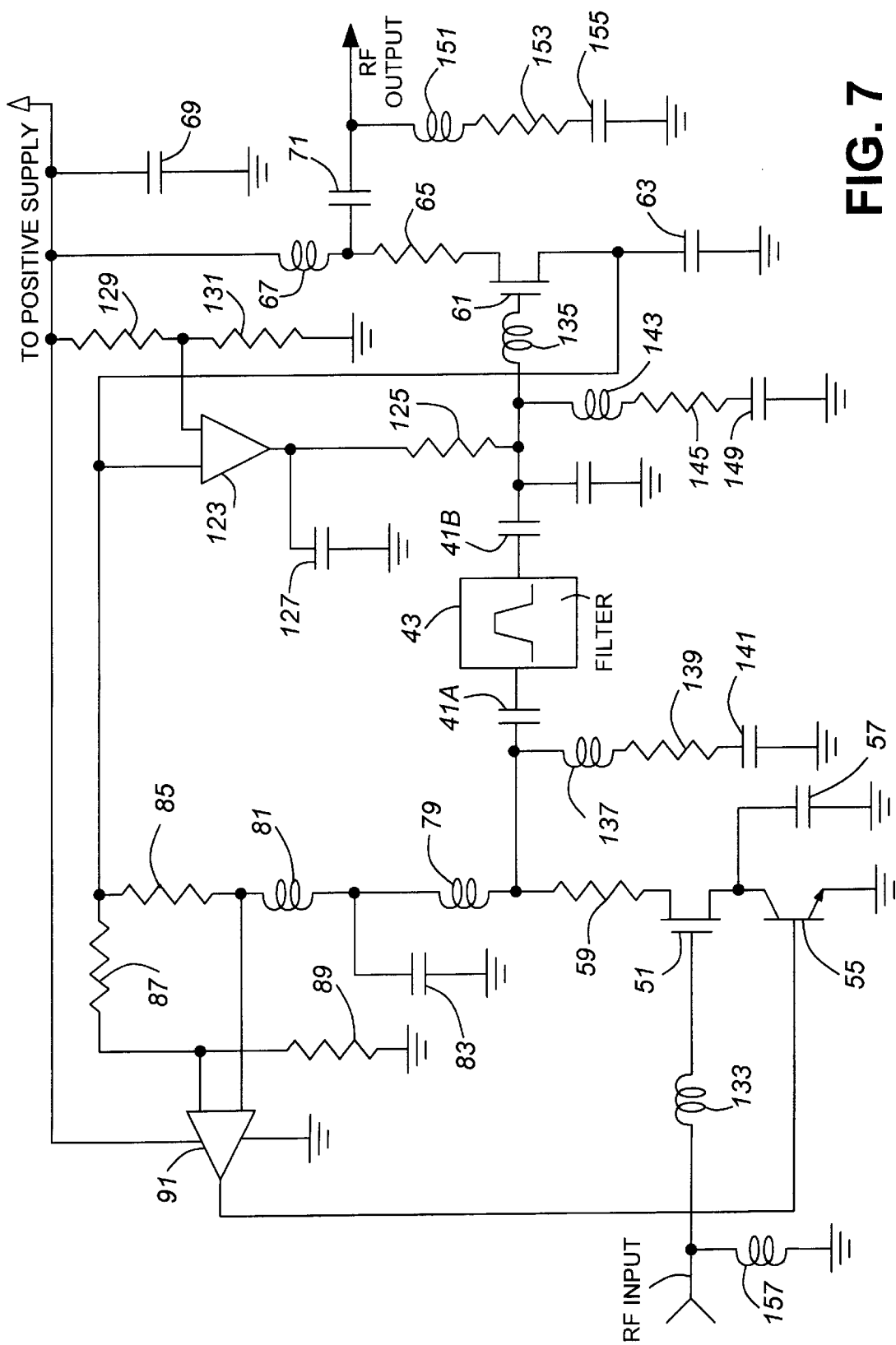
Figure 8:
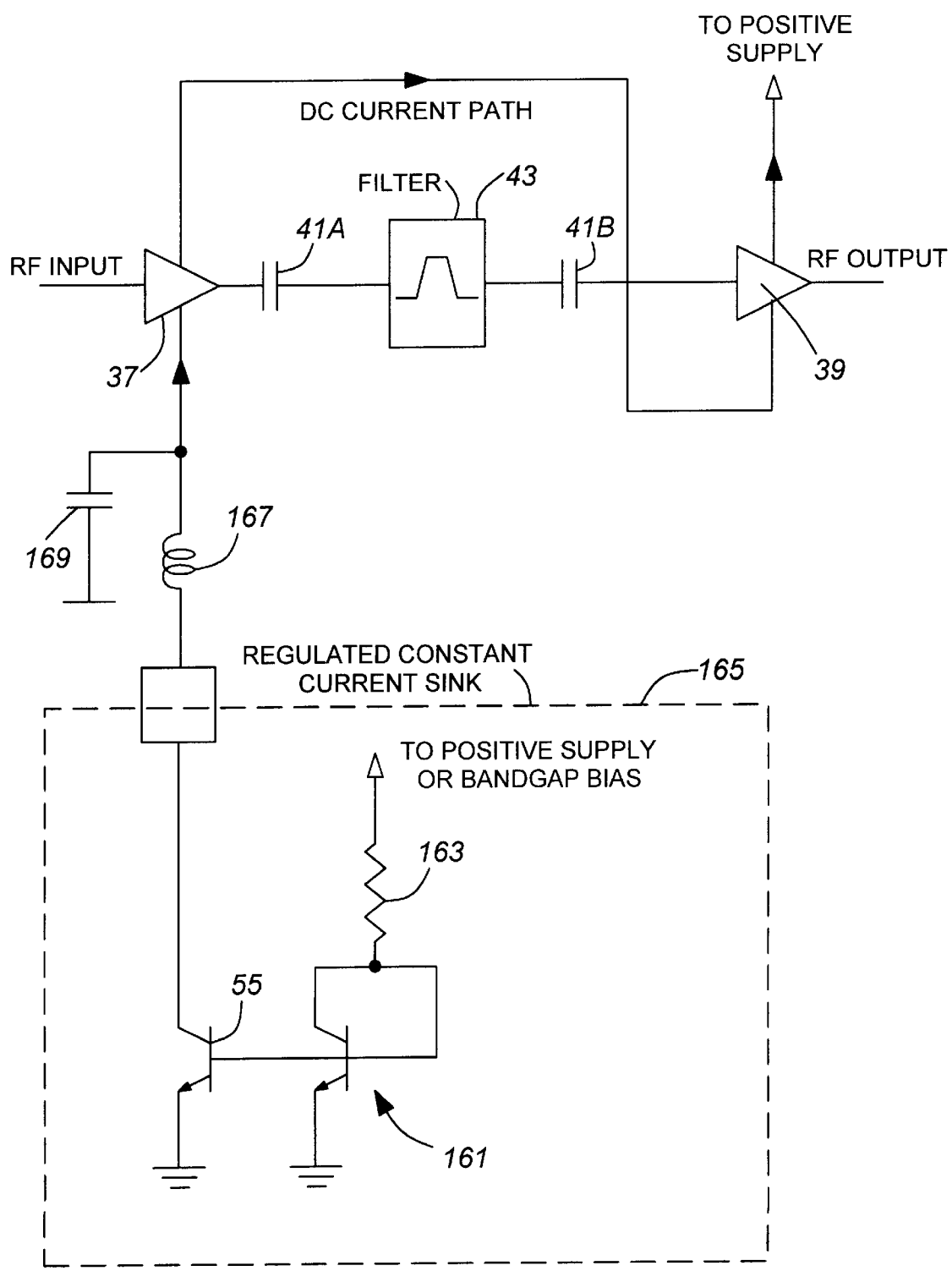

FIG. 2(a) is a schematic diagram of a LNA illustrating one biasing scheme, which uses a degenerative source resistor, FIG. 2(b) is a schematic diagram of a LNA illustrating another form of biasing scheme, which uses a negative bias pump, FIG. 3 is a block diagram showing an embodiment of the present invention in its basic form, FIG. 4 is a schematic diagram of an embodiment of the invention, FIG. 5 is a schematic diagram of another embodiment of the invention, FIG. 6 is a schematic diagram of another embodiment of the invention, FIG. 7 is a schematic diagram of another embodiment of the invention, and FIG. 8 is a partly block and partly schematic diagram of another embodiment of the invention.

DETAILED DESCRIPTION OF EMBODIMENTS OF THE INVENTION

Turning to FIG. 3, a pair of LNA stages 37 and 39 are shown, wherein stage 39 amplifies the output signal of stage 37. An input signal such as an RF signal of microwave frequency is input to stage 37.

The two stages are AC coupled (which blocks flow of DC), such as via capacitors 41A and 41B coupled via anti-aliasing filter 43.

A DC power supply has e.g. its negative pole connected to ground and its positive pole connected to a positive power input 45A of the second stage 39. A negative power input 45B of the second stage 39 is connected to the positive power input 47A of the first stage 37. The negative power input 47B of the first stage 37 is connected to ground. In this manner, the power inputs of both stages are connected in series between the positive pole of the power supply and ground, and share the power supply voltage. The power supply current, passing through both stages, is used twice. A circuit is also included to block the AC signal from passing from one amplifier to another via the DC power conduction paths.

FIG. 4 illustrates a specific circuit to implement the above, in accordance with one embodiment.

An input signal is applied to the gate of an FET 51. A resistor 53 (which could alternatively be an inductor) is connected between the gate of FET 51 and ground. The collector of a bipolar transistor 55 is connected to the source of FET 51, and is bypassed by capacitor 57 to ground. The emitter of transistor 55 is connected to ground. The bipolar transistor can be of NPN type. The FETs can be n-channel types.

A resistor 59 is connected at one node to the drain of FET 51, and at the other end to an input node of an AC coupling circuit, for example which includes the series of capacitors 41A and 41B separated by filter 43. The other node of the AC coupling circuit is coupled to the gate of FET 61.

The source of FET 61 is connected via capacitor 63 to ground. The drain of FET 63 is connected via a resistor 65 and an AC blocking choke 67 to a positive node of a power supply (which is preferably bypassed to ground by a capacitor 69). An output signal from FET 61 is obtained from the junction of resistor 65 and choke 67 via capacitor 71.

A voltage divider comprising the series of resistors 73 and 75 is connected across the power supply positive node to ground. The junction of the two resistors 73 and 75 is connected to the gate of FET 61, to provide DC bias voltage thereto.

The junction of resistor 59 and the AC coupling circuit is connected to the series of chokes 79 and 81 (their junction being bypassed to ground by capacitor 83) and to one node of resistor 85, the latter, as will be explained later, forming a sensing resistor. The other node of resistor 85 is connected to the source of FET 61.

The source of FET 61 is also connected via the series of resistors 87 and 89 to ground. The junction of resistors 87 and 89 is connected to an input of operational amplifier 91, and the junction of resistor 85 and choke 81 is connected to the other input of operational amplifier 91. The output of operational amplifier 91 is connected to the base of transistor 55.

It may be seen that in a conventional manner, the AC input signal is applied to the gate of FET 51, is amplified, and passes via the AC coupling circuit capacitor 41A, filter 43 and capacitor 41B to the gate of FET 61, where it is amplified and passes via capacitor 71 to the output. The AC coupling circuit blocks DC in a conventional manner.

However, the DC operation current path for FET 51 is via resistor 59, chokes 79 and 81, resistor 85, the source-drain circuit of FET 61, resistor 65 and choke 67 to the positive pole of the power supply. The same current passes through both FET 51 and FET 61, and the power supply voltage divides between the two FETs.

Choke 81 acts as an RF choke and serves to block AC signals from passing into the DC current path to the source of FET 61. Thus choke 81 serves to separate the AC and DC paths. Similarly choke 67 blocks AC signals from passing into the DC current path to the power supply.

Choke 79 and capacitor 41A provide AC impedance matching from the FET 51 output to the filter 43. Resistor 59 is a stabilizing resistor which plays no active role in the biasing (since at low frequencies, the drain of FET 61 provides a constant current output).

In order to control the current, a negative feedback loop is used. The bipolar transistor 55 acts as a constant current sink and thus its collector current defines the source to drain current in FET 51. This bias current passes through series resistor 85. The resulting voltage across resistor 85 is a sensed voltage, and thus resistor 85 can be termed a sensing resistor.

In order to establish the correct biases on the two FETs 51 and 61, the gate bias of FET 61 is defined by the voltage at the junction of the divider comprised of resistors 73 and 75. This determines the source potential of FET 61 to be its threshold Vt above its gate potential. By these means the supply voltage is split across FETs 51 and 61.

The voltage across sensing resistor 85 is made equal to the voltage across resistor 87, which is established by the divider formed of resistors 87 and 89. Thus it may be seen that if the current in the sense resistor 85 is low compared with that defined by the divider (87,89), the base of the bipolar transistor 55 is driven more positive (which increases its current flow) and vice versa.

By the above means the current in both the FETs 51 and 61 is defined by a single loop, and the DC current is "used" twice.

When the FETs are GAAS FETs or PHEMPT FETs (to maintain both a low noise figure and high gain), the minimum drain to source voltage required is lower than 1 volt. It is therefore possible that the whole circuit can operate within a power supply voltage of only 2.7V, provided that the sensing operational amplifier 91 is of a type which is capable of operation from a single low voltage supply. Such amplifiers are readily available.

FIG. 5 illustrates a circuit in which the bias is provided by a conventional capacitive negative voltage pump circuit, instead of being provided via a bipolar transistor. In FIG. 5, all of the like referenced elements are the same as in the circuit of FIG. 4, except that transistor 55 and capacitor 57 have been deleted, and the emitter of FET 51 is connected to ground.

A preferably capacitive, negative charge pump (connected between the positive pole of the power supply and ground) is driven by the output of operational amplifier 91. The output of the charge pump is connected via a resistor 97 (bypassed by capacitor 99 to ground) to the gate of FET 51. The AC input signal is AC coupled to the gate of FET 51 (via capacitor 101) in order to block the DC negative bias voltage from appearing on the output of the previous stage (which can be the antenna).

With the fixed negative bias potential applied to the gate of FET 51, it provides the constant current sink function provided by bipolar transistor 55 in the embodiment of FIG. 4.

This embodiment offers the advantage that the bipolar transistor 55 of the embodiment of FIG. 4 is eliminated, and that the source of FET 51 is connected directly to ground, thus eliminating the requirement for bypass capacitors, and simplifying the stability requirements.

Both of the above embodiments are convenient to integrate, where advantage can be taken of bandgap voltages and additional amplifiers. FIG. 6 is a schematic diagram of an embodiment which is configured so that the bias current is determined as a function of a bandgap voltage divided by resistance of a resistor or the equivalent.

FIG. 6 is a circuit similar to FIG. 4, except that a further circuit is interposed between the output of the operational amplifier 91 and the base of bipolar transistor 55. In addition, operational amplifier 91 is configured as a differential amplifier, as will be described below.

Instead of resistors 87 and 89, resistors 105 and 107 connect the respective inputs of amplifier 91 to opposite ends of resistor 85. Resistor 109 is connected between one input of amplifier 91 and ground, and resistor 111 is connected between the other input of amplifier 91 and its output.

The output of amplifier 91 is coupled to an input of operational amplifier 113. A bandgap reference voltage generator 115 is connected via resistor 117 to the other input of operational amplifier 113. Resistor 119 is connected between the latter input and ground. The output of operational amplifier 113 is connected to the input of transistor 55.

In operation, the amplifier bias current flows through sensing resistor 85, and its magnitude is indicated by the resulting voltage across resistor 85. Amplifier 91 combined with resistors 105, 111, 109 and 107 serve as a differential amplifier which generates an output, applied to an input of amplifier 113, which is proportional to the voltage across resistor 85, but with respect to ground.

The output of the very low current bandgap voltage generator 115 is input to the voltage divider formed by resistors 117 and 119, the junction of which providing a reference voltage at the other input of amplifier 113. The sense of the feedback is so as to make an output of amplifier 91 track the reference input to amplifier 113.

By the above circuitry, the bias current of FET 51 is determined by a resistor ratio, and is independent of the supply voltage.

Current determining resistor 85 can be made a discrete component, thereby making the bias current largely independent of both supply voltage and temperature, within a wide range. Thus the current consumption using for example a 5V power supply would be virtually the same as that at for example 3V.

It should be noted that the negative charge pump described may be combined with the bandgap biasing described, to achieve a similar end result. Either version would be suitable for integration.

It is common for operational amplifiers to be packaged in pairs. The extra amplifier can be used to bias the gate of the second stage transistor 61 as shown in FIG. 7. FIG. 7 has the similarly referenced elements as FIG. 4, except for the additional elements as will be described below.

The voltage dividing resistors 73 and 75 of FIG. 4 are deleted, and instead the output of a second operational amplifier 123 is connected via a resistor 125 (bypassed via capacitor 127 to ground) to the source of FET. One input of amplifier 123 is coupled to the source of FET 71. The other input of amplifier 123 is connected to the junction of a serially connected pair of resistors 129 and 131 which are connected between the positive power supply node and ground, which provides a fixed reference voltage to the amplifier 123. The bias voltage for FET 61 is provided from the output of amplifier 123.

The biasing circuit has been found to be inherently stable at low frequencies, and bias stabilization is not required.

Also shown in FIG. 7 are inductor 133 which is in series with the input signal path to the gate of FET 51, and inductor 135 which is in series with the signal path to the gate of FET 61. These inductors can be used to compensate for the capacitive input inputs to FETs 51 and 61.

The series circuits of inductor 137 and resistor 139 (with large capacitor 141), inductor 143 and resistor 145 (with large capacitor 149), and inductor 151 and resistor 153 (with large capacitor 155), as well as inductor 157, all connected across AC signal paths at the input and output of the AC coupling circuit between the output of FET 51 and the input of FET 61, the output or FET 61, and the input of FET 51, respectively, can be used for impedance matching purposes.

An embodiment of the invention has thus provided a bias circuit for a low power, high gain LNA which defines the bias current in two or more stages simultaneously by the use of negative feedback, by sensing a small potential across a sensing resistor in circuit configuration in which the amplifier transistors are arranged in series with each other and with the sensing resistor for the direct current path, such that the two or more stages provide independent radio frequency gain stages.

In another embodiment, the sensed voltage is compared with a bandgap voltage, which eliminates bias current dependence on temperature and power supply voltage.

In another embodiment, a first bias voltage is generated by means of a variable negative voltage capacitive pump bias generator to precisely define the bias current in two or more stages simultaneously by the use of negative feedback, by sensing a small voltage across a sensing resistor in a circuit configuration in which the amplifier transistors are arranged in series with each other and with the sensing resistor in the direct current path, and whereby the two or more stages provide independent radio frequency gain stages.

In another embodiment the sensed voltage of the embodiment described in the above paragraph is compared with a bandgap voltage to eliminate bias current dependence on temperature and power supply voltage.

FIG. 8 illustrates a bias circuit which has a current source or sink form of bias for the circuit which utilizes to some DC current twice. The elements thereof which are common to FIG. 3 are shown with similar reference numerals.

Instead of feedback controlled by current sensing as described in the preceding embodiments, the base current of bipolar transistor 55 passes through and is controlled by a current mirror 161. Current mirror 161 is biased either from a resistor 163 connected to a power supply (its positive pole, with the NPN bipolar transistor configuration shown), or from a bandgap voltage source. The bias thus controls the current passing through both amplifier stages.

Transistor 55 and current mirror 161 (and resistor 163) can be formed as an integrated circuit 165.

The current mirror, and/or integrated circuit 165 could alternatively be implemented using field effect transistors, complementary field effect transistors (CMOS) or BiCMOS which uses a combination of bipolar and CMOS elements.

In order to eliminate noise which may be generated by the current sink or at the grounding points, it is preferred to couple the circuit to the first amplifier stage 37 via a filter, e.g. formed of an inductor 167 connected in series between circuit 165 and amplifier 37 so as to carry its DC current, and a capacitor 169 connected between the junction of inductor 167 and the amplifier stage 37, and ground.

A person understanding the above-described invention may now conceive of alternative designs, using the principles described herein. All such designs which fall within the scope of the claims appended hereto are considered to be part of the present invention.

I claim:

1. A bias circuit for a pair of field effect transistor (FET) stages comprising a circuit for AC coupling a signal amplified by a first stage to the input of a second stage, a power source for supplying DC operating current to both of the stages in series, a circuit for sensing operating current drawn by the second stage and in response thereto for controlling bias of the first stage, and a circuit for blocking AC signals amplified by the first stage from being passed via a DC operating current path to the second stage, whereby the same DC operating current is passed through both first and second stages and is blocked from passing through the AC coupling circuit, including a circuit for comparing a voltage derived from the sensed current with a bandgap voltage and for raising or reducing bias as a result of any difference therebetween.

2. A bias circuit as defined in claim 1 in which the FETs are GAAS or PHEMPT GAAS transistors.

3. A bias circuit as defined in claim 2 in which the signal has a frequency which is at least as high as 1 Ghz.

4. A bias circuit for a pair of field effect transistor (FET) stages comprising a circuit for AC coupling a signal amplified by a first stage to the input of a second stage, a power source for supplying DC operating current to both of the stages in series, a circuit for sensing operating current drawn by the second stage and in response thereto for controlling bias of the first stage, and a circuit for blocking AC signals amplified by the first stage from being passed via a DC operating current path to the second stage, whereby the same DC operating current is passed through both first and second stages and is blocked from passing through the AC coupling circuit, including a charge pump controlling circuit for controlling a charge pump from said sensed current, and for controlling said bias by the charge pump.

5. A bias circuit for a pair of field effect transistor (FET) stages comprising a circuit for AC coupling a signal amplified by a first stage to the input of a second stage, a power source for supplying DC operating current to both of the stages in series, a circuit for sensing operating current drawn by the second stage and in response thereto for controlling bias of the first stage, and a circuit for blocking AC signals amplified by the first stage from being passed via a DC operating current path to the second stage, whereby the same DC operating current is passed through both first and second stages and is blocked from passing through the AC coupling circuit, including a comparing circuit for comparing a voltage derived from the sensed current with a bandgap voltage, a charge pump controlling circuit for controlling a charge pump as a result of any difference therebetween, and for controlling said bias by the charge pump.

6. A bias circuit for a pair of field effect transistor (FET) stages comprising a circuit for AC coupling a signal amplified by a first stage to the input of a second stage, a power source for supplying DC operating current to both of the stages in series, a circuit for sensing operating current drawn by the second stage and in response thereto for controlling bias of the first stage, and a circuit for blocking AC signals amplified by the first stage from being passed via a DC operating current path to the second stage, whereby the same DC operating current is passed through both first and second stages and is blocked from passing through the AC coupling circuit, and in which the first and second stages are comprised of respective first and second FETs, the power source having one polarity node coupled to the drain of the second FET and having an opposite polarity node coupled to the source of the first FET, the circuit for sensing being comprised of a resistor which is DC coupled between the source-drain circuit of the second FET and the drain-source circuit of the first FET and a circuit for detecting a voltage drop across the resistor and for controlling bias of the first FET, and further including a circuit for blocking AC signals amplified by either of the FET stages from passing into DC current supply lines between the FETs and between the power source and one of the FETs.

7. A bias circuit as defined in claim 6 in which the circuit for sensing is further comprised of an operational amplifier having inputs coupled across the resistor, the output of the operational amplifier being coupled to a bias controlling circuit.

8. A bias circuit as defined in claim 7 in which the bias controlling circuit is comprised of a bipolar transistor having its collector-emitter circuit connected in series between the source-drain circuit of the first FET and said opposite polarity node of the power source, said opposite polarity node being connected to ground, the output of the operational amplifier being coupled to the base of the bipolar transistor, and further including a first capacitor connected between a junction between the bipolar transistor and the first FET, and ground, and a second capacitor connected between the point of DC coupling of the resistor to the source-drain circuit of the second FET, and ground.

9. A bias circuit as defined in claim 8 in which the FETs are of n-channel types, the second capacitor and the resistor being connected to the source of the second FET, the bipolar transistor being of NPN type having its collector connected to the source of the second FET, the one polarity node of the power supply being positive relative to the opposite polarity node of the power supply.

10. A bias circuit as defined in claim 8 in which the bias controlling circuit is further comprised of a second operational amplifier interposed between the first operational amplifier and the bipolar transistor, wherein the output of the second operational amplifier is connected to the base of the bipolar transistor, the output of the first operational amplifier is coupled to an input of the second operational amplifier, and a bandgap reference voltage generator is coupled to another input of the second operational amplifier, the first operational amplifier being configured as a differential amplifier referenced to ground.

11. A bias circuit as defined in claim 8 in which the circuit for blocking AC signals is comprised of one or more chokes coupled in series with a DC supply line in series between the drain-source circuit of the first FET, the sensing resistor, and the source-drain circuit of the second FET.

12. A bias circuit as defined in claim 7 in which the bias controlling circuit is comprised of a charge pump having an input connected to the output of the operational amplifier and an output coupled to the gate of the first FET.

13. A bias circuit as defined in claim 8, further including another operational amplifier having an input coupled to a junction between the resistor and the source-drain circuit of the second FET and another input connected to a fixed voltage point, the another operational amplifier having an output which is DC coupled to the gate of the second FET.

14. A bias circuit comprising a first n-channel FET and a second n-channel FET, an NPN bipolar transistor, the emitter of the bipolar transistor being connected to ground, the collector of the bipolar transistor being connected to the source of the first FET, a bypass capacitor connected between the collector and ground, a first resistor having a node connected to the drain of the first FET, a first coupling capacitor coupled between another node of the first resistor and the gate of the second FET, a circuit for applying a bias voltage to the gate of the second FET, a pair of chokes connected in series having one end node connected to the junction of the first coupling capacitor and the first resistor, a second bypass capacitor connected between the junction of the chokes and ground, a sensing resistor connected between another end node of the chokes and the source of the second FET, a third bypass capacitor connected between the source of the second FET and ground, a second resistor connected between the drain of the second FET and a terminal of a further choke, another terminal of the further choke being connected to a positive node of a power supply, a pair of resistors connected in series between the source of the second FET and ground, an input of an operational amplifier connected to a junction of the pair of resistors, another input of the operational amplifier connected to a junction of the sensing resistor and the pair of chokes, the output of the operational amplifier being connected to the base of the bipolar transistor, an input circuit for applying an input signal to the gate of the first FET, and an output circuit AC coupling an output signal connected to the junction of the second load resistor and the further choke.

15. A bias circuit as defined in claim 14 in which the circuit for applying a bias to the gate of the second FET is a pair of resistors forming a voltage divider connected between a positive DC power supply node and ground and having a junction connected to the gate of the second FET.

16. A bias circuit as defined in claim 14, in which the circuit for applying bias to the gate of the second FET is comprised of a further operational amplifier having an input connected to the junction of the sensing resistor and the pair of resistors, a further pair of resistors connected in series between the positive node of the power supply and ground, another input of the second operational amplifier connected to a junction of the second pair of resistors, and a first further choke coupled to the first coupling capacitor and connected at one end to the gate of the second FET, the output of the further operational amplifier being coupled via a resistor to another end of the first further choke.

17. A bias circuit comprising a first n-channel FET and a second n-channel FET, the source of the first FET being connected to ground, a first resistor having a node connected to the drain of the first FET, a first coupling capacitor coupled between another node of the first resistor and the gate of the second FET, a circuit for applying a bias voltage to the gate of the second FET, a pair of chokes connected in series having one end node connected to the junction of the first coupling capacitor and the first resistor, a second bypass capacitor connected between the junction of the chokes and ground, a sensing resistor connected between another end node of the chokes and the source of the second FET, a third bypass capacitor connected between the source of the second FET and ground, a second resistor connected between the drain of the second FET and a terminal of a further choke, another terminal of the further choke being connected to a positive node of a power supply, a pair of resistors connected in series between the source of the second FET and ground, an input of an operational amplifier connected to a junction of the pair of resistors, another input of the operational amplifier connected to a junction of the sensing resistor and the pair of chokes, the output of the operational amplifier being connected to an input of a charge pump, and output of the charge pump being connected via a bias resistor to the gate of the first FET, an input circuit for AC coupling an input signal to the gate of the first FET, and an output circuit AC coupling an output signal connected to the junction of the second load resistor and the further choke.

18. A bias circuit comprising a first n-channel FET and a second n-channel FET, an NPN bipolar transistor, the emitter of the bipolar transistor being connected to ground, the collector of the bipolar transistor being connected to the source of the first FET, a bypass capacitor connected between the collector and ground, a first resistor having a node connected to the drain of the first FET, a first coupling capacitor coupled between another node of the first resistor and the gate of the second FET, a circuit for applying a bias voltage to the gate of the second FET, a pair of chokes connected in series having one end node connected to the junction of the first coupling capacitor and the first resistor, a second bypass capacitor connected between the junction of the chokes and ground, a sensing resistor connected between another end node of the chokes and the source of the second FET, a third bypass capacitor connected between the source of the second FET and ground, a second resistor connected between the drain of the second FET and a terminal of a further choke, another terminal of the further choke being connected to a positive node of a power supply, a pair of resistors connected in series between the junction of the pair of chokes and the sensing resistor and ground, an input of an operational amplifier connected to the junction of the pair of resistors, a further pair of resistors connected in series between an opposite end of the sensing resistor and an output of the operational amplifier, another input of the operational amplifier connected to the junction of the further pair of resistors, the output of the operational amplifier being connected to an input of a second operational amplifier, the output of the second operational amplifier being connected to the base of the bipolar transistor, a bandgap reference voltage generator being connected to another input of the second operational amplifier, an input circuit for applying an input signal to the gate of the first FET, and an output circuit AC coupling an output signal connected to the junction of the second load resistor and the further choke.

19. A bias circuit for a pair of field effect transistor (FET) stages comprising a circuit for AC coupling a signal amplified by a first stage to the input of a second stage, a power source for supplying DC operating current to both of the stages in series, a circuit for sensing operating current drawn by the second stage and in response thereto for controlling bias of the first stage, and a circuit for blocking AC signals amplified by the first stage from being passed via a DC operating current path to the second stage, whereby the same DC operating current is passed through both first and second stages and is blocked from passing through the AC coupling circuit, and a current source or sink for fixing the DC current passing through the stages in series, and a circuit for blocking AC signals amplified by the first stage from being passed via a DC operating current path to the second stage, whereby the same DC operating current is passed through both first and second stages and is blocked from passing through the AC coupling circuit.

20. A bias circuit as defined in claim 19 in which the current source or sink is comprised of a current mirror biased from the power source.

21. A bias circuit as defined in claim 19 in which the current source or sink is comprised of a current mirror biased from a bandgap voltage source.

* * * * *